(12) United States Patent
Van Der Wiel (10) Patent No.: US 10,262,897 B2
(45) Date of Patent: Apr. 16, 2019

(54) BOND PAD PROTECTION FOR HARSH MEDIA APPLICATIONS

(71) Applicant: Melexis Technologies NV, Tessenderlo (BE)

(72) Inventor: Appolonius Jacobus Van Der Wiel, Duisberg (BE)

(73) Assignee: MELEXIS TECHNOLOGIES NV, Tessenderlo (BE)

( * ) Notice: Subject to any disclaimer, the term of this patent is extended or adjusted under 35 U.S.C. 154(b) by 0 days.

(21) Appl. No.: 15/883,487

(22) Filed: Jan. 30, 2018

(65) Prior Publication Data
US 2018/0218937 A1    Aug. 2, 2018

(30) Foreign Application Priority Data

Feb. 2, 2017   (EP) ..................................... 17154431

(51) Int. Cl.
*H01L 23/48*      (2006.01)
*H01L 23/52*      (2006.01)
(Continued)

(52) U.S. Cl.
CPC ...... *H01L 21/7685* (2013.01); *G01L 19/0069* (2013.01); *G01L 19/141* (2013.01);
(Continued)

(58) Field of Classification Search
USPC ....... 257/457, 459, 503, 573, 584, 602, 621, 257/664–677, 688–700, 734–786, 257/E23.141, E23.142, E23.145, E23.168, 257/E23.146, E23.175, E21.575, E21.627, 257/E21.641
See application file for complete search history.

(56) References Cited

U.S. PATENT DOCUMENTS 9,502,248 B1 * 11/2016 Gatterbauer ........ H01L 21/0331
2012/0217507 A1 * 8/2012 Ohki ................... H01L 29/2003
                                                             257/76

FOREIGN PATENT DOCUMENTS

EP         1947439 A1    7/2008
EP         2680304 A2    1/2014
(Continued)

OTHER PUBLICATIONS

European Search Report from EP Application No. 17154431.5, dated Aug. 7, 2017.

*Primary Examiner* — Niki H Nguyen
(74) *Attorney, Agent, or Firm* — Workman Nydegger (57) ABSTRACT

A method for making and a semiconductor device comprises a silicon die including a metal contact region and, at least one passivation layer covering the semiconductor die and patterned such as to form an opening to the metal contact region of the semiconductor die. A continuous part of a contact layer comprises a refractory metal, and overlaps and completely covers the opening in the at least one passivation layer to contact the metal contact region in the opening and adhere to the at least one passivation layer along the entire edge of the continuous part. The contact layer comprises at least an adhesion layer and at least a diffusion barrier layer. A noble metal layer is arranged over the contact layer and completely covers the continuous part to adhere to the at least one passivation layer around the edge of the continuous part.

10 Claims, 7 Drawing Sheets

(51) Int. Cl.
| | |
|---|---|
| *H01L 29/40* | (2006.01) |
| *H01L 21/768* | (2006.01) |
| *H01L 23/538* | (2006.01) |
| *H01L 23/532* | (2006.01) |
| *G01L 19/00* | (2006.01) |
| *G01L 19/14* | (2006.01) |
| *H01L 23/00* | (2006.01) |

(52) U.S. Cl.
CPC .... *H01L 21/76873* (2013.01); *H01L 23/5384* (2013.01); *H01L 23/53252* (2013.01); *H01L 24/03* (2013.01); *H01L 24/05* (2013.01); *H01L 2224/02126* (2013.01); *H01L 2224/031* (2013.01); *H01L 2224/0345* (2013.01); *H01L 2224/03462* (2013.01); *H01L 2224/03472* (2013.01); *H01L 2224/03474* (2013.01); *H01L 2224/05155* (2013.01); *H01L 2224/05164* (2013.01); *H01L 2224/05166* (2013.01); *H01L 2224/05181* (2013.01); *H01L 2224/05184* (2013.01); *H01L 2224/05556* (2013.01); *H01L 2224/05639* (2013.01); *H01L 2224/05644* (2013.01); *H01L 2224/05664* (2013.01); *H01L 2224/05669* (2013.01); *H01L 2224/05681* (2013.01); *H01L 2224/48091* (2013.01); *H01L 2224/48145* (2013.01); *H01L 2224/48247* (2013.01); *H01L 2224/85205* (2013.01); *H01L 2924/1815* (2013.01)

(56) References Cited

FOREIGN PATENT DOCUMENTS

| | | | |
|---|---|---|---|
| JP | 201524393 | * | 11/2015 |
| JP | 2015204393 A | | 11/2015 |
| WO | 2007149492 A2 | | 12/2007 |

* cited by examiner

BOND PAD PROTECTION FOR HARSH MEDIA APPLICATIONS

FIELD OF THE INVENTION

The invention relates to the field of integrated semiconductor devices for use in harsh media applications. More specifically it relates to methods for fabricating an integrated circuit semiconductor device for use in harsh media and a related semiconductor device.

BACKGROUND OF THE INVENTION

Standard semiconductor devices may be less suitable, e.g. may be unsuitable, for use in harsh media conditions, e.g. under exposure to sulfuric or fuming nitric acids or to iodine. For example, bond pad metals, such as aluminium or copper, may corrode, e.g. due to oxidation, when exposed to such chemicals. It is known in the art to cover the bond pads by a protective gold layer. However, a diffusion barrier may be needed in between the bond pad and the gold. For example, without a diffusion barrier, aluminium and gold may easily and rapidly diffuse into each other, which may be even more problematic in high temperature applications. Providing a protective noble metal layer of gold, palladium or platinum on the device allows to maintain the advantages of standard CMOS processing in a device for harsh media conditions, such as an efficient volume production and a good electrical contact between the interconnect metal and an integrated circuit in the silicon. However, ensuring the integrity of the adhesion layer and the diffusion barrier when the device is exposed to the harsh environment remains challenging.

Figure 1:
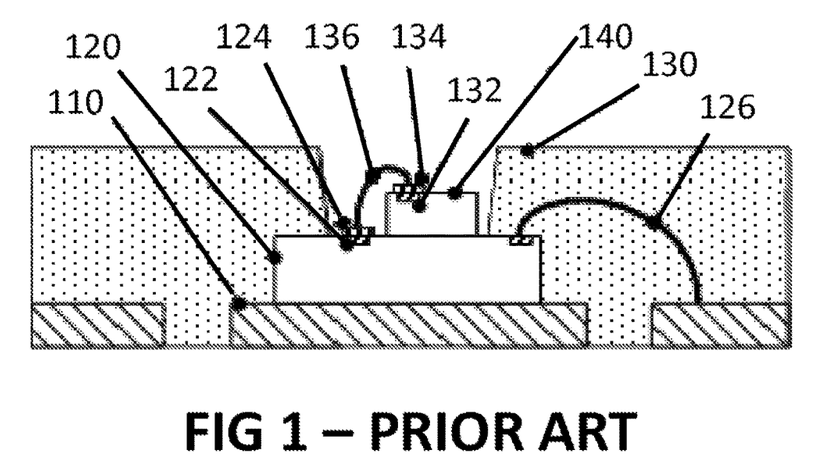
FIG. 1 shows an exemplary integrated circuit semiconductor device for use in harsh media as known in the art.

FIG. 1 shows a cross section of an exemplary integrated circuit semiconductor device, e.g. a hybrid pressure sensor, for harsh media as known in the art. In such hybrid pressure sensor, a bond wire 136 can be used to electrically connect a sensor 130 to a CMOS interface chip 120. Another exemplary bond wire 126 may connect the CMOS interface chip to a substrate 110, such as a leadframe or printed circuit board (PCB). The wires 126,136 may be protected for harsh media by a mould compound 140. During the moulding, a cavity on top of the device can be created, in which the sensor 130, e.g. a pressure sensor, can be mounted. Thus, the bond wire 136 can be provided in this cavity to connect a sensor bond pad 132 to a bond pad 122 of the CMOS interface chip.

Figure 2:
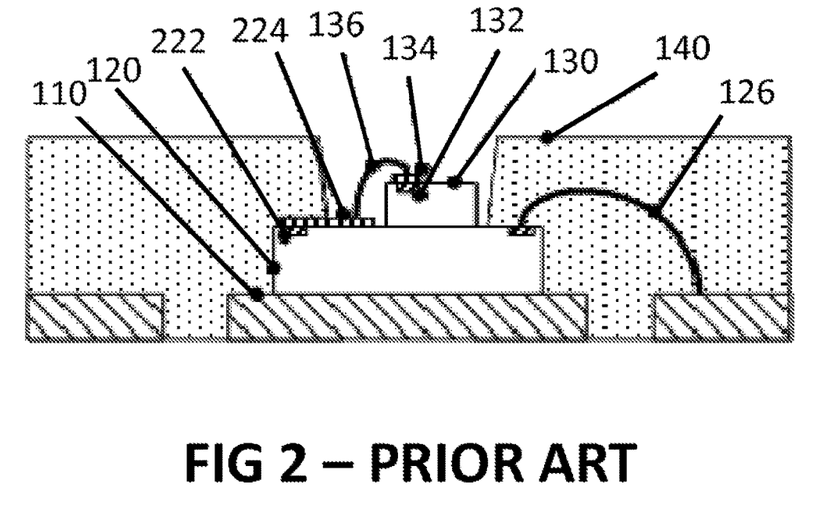
FIG. 2 shows an exemplary integrated circuit semiconductor device for use in harsh media, using bond pad redistribution, as known in the art.

For example, it is known in the art to provide the bond pad 122 of the CMOS interface chip in the cavity, and covering the aluminium of this bond pad 122 by a gold layer 124. Likewise, the bond pad 132 of the sensor 130 may be covered by a gold layer 134. Alternatively, as shown in FIG. 2, it is also known in the art to cover the bond pad 222 of the CMOS interface chip by the mould compound 140. In such prior-art devices, the gold layer 224 covering the CMOS bond pad 222 may extend into the cavity, thus acting as a signal conductor between the bond pad 222 and the bond wire 136 that is resilient to the harsh environment. This type of extension is known in the art as a 'redistribution' of the bond pad. This has the advantage that the mould compound protects the interface from bond pad to redistribution.

It is known in the art to deposit gold onto an aluminium bond pad by electroless plating, e.g. first a layer of nickel is grown on the aluminium bond pad, followed by electroless plating of a thin gold layer. The nickel may then form a suitable diffusion barrier. However, while the layers provided on the bond pad by an electroless plating method may firmly adhere to the bond pad metal, no mechanical connection is realized between the protective layers and the passivation around the bond pad. This has the disadvantage that chemicals, such as the aforementioned chemicals that can be present in harsh media, may penetrate the interface between the passivation and the plated metals and corrode the bond pad metal. For example, a mechanical and chemically resistant connection between the gold layer and the passivation could be highly advantageous.

For example, EP 1947439 describes a deposition of gold on a TiW barrier of a bond pad by electroless plating. The method described in EP 1947439 may have the disadvantage that harsh media such as iodine may still penetrate between the passivation layer and the gold and attack the TiW layer. Once the TiW is etched, the aluminium will be exposed to the iodine and can be etched very quickly. Furthermore, since the silicon substrate is not completely covered with passivation, galvanic corrosion can also take place through the interface, e.g. by an electron exchange partly through the substrate.

It is furthermore known in the art to deposit gold by electroplating. For example, a seed layer may be deposited over the entire substrate to distribute the plating current over the substrate. This seed layer remains between the CMOS metal and the layer that is plated on top of the seed layer. The seed layer normally serves as an adhesion layer, a diffusion barrier between the CMOS metal and the metal plated on top, and as a low resistive layer for a uniform current distribution during plating. Therefore, often TiW, Ti or TiN is sputtered first to provide an adhesion and barrier layer, followed by the sputtering of a highly conductive layer such as gold or copper to allow high plating currents. The sputtered seed layer can advantageously also form a solid mechanical connection to a silicon nitride passivation. This strong adhesion may result from the kinetic energy of the sputtered metal atoms hitting the substrate. Unfortunately, organic mould materials may not adhere well to the seed layer when a noble metal is used. It is furthermore known in the art to sputter a second adhesion layer on top of a highly conductive noble metal layer to ensure a good adhesion of the plating to a mould.

However, after the electroplating of the gold on the bond pads, the seed layer needs to be etched away to ensure that no electrical connection between different structures remains, such that the edge of the seed layer at the bottom of the gold structure is exposed to the environment, e.g. to the aforementioned corrosive chemicals in a harsh media application. It is known to apply an additional organic protection layer after etching the seed layer to cover the exposed edge of the seed layer. However, such protection layers may have a poor adhesion to gold, and corrosive chemicals may yet penetrate the interface between the protection layer and the gold metal.

Another disadvantage of known strategies in which the bond pads are covered with gold is that standard CMOS passivation is relied upon to protect the interconnect, e.g. the aluminium or copper interconnect. This passivation may however be insufficient to block the aforementioned corrosive chemicals. For example, particularly iodine may tend to completely remove aluminium wires when only one small defect, e.g. a small pinhole, is present in the passivation layer covering the interconnect. For that reason, it is known to cover the passivation with an additional layer such as polyimide. Such an extra passivation layer may be referred to as a 'repassivation layer.' Such repassivation layer may be opened at the bond pads with an opening that is smaller than the passivation bond pad opening. The seed layer may then be sputtered on top of this polyimide layer.

SUMMARY OF THE INVENTION

It is an object of embodiments of the present invention to provide good and efficient fabrication of an integrated circuit semiconductor device, for use in a harsh media environment.

It is an advantage of embodiments of the present invention that corrosive chemicals in a harsh media environment are prevented from contacting internal layers of the semiconductor device, such as an adhesion layer, by a noble metal layer.

It is an advantage of embodiments of the present invention that a good mechanical contact and a good mechanical connection can be ensured between a protective noble metal layer and a passivation layer of the semiconductor device. It is a further advantage that such good mechanical contact and connection can be ensured of the noble metal to the passivation around a bond pad. This may be particularly advantageous when the protective noble metal layer is also used to re-distribute the bondpads.

It is a further advantage of embodiments of the present invention that a good mechanical connection of the noble metal can prevent that a harsh environment deteriorates a bond pad and/or an interconnect of the semiconductor device.

It is an advantage of embodiments of the present invention that an adhesion and barrier layer can be provided between the noble metal and the bond pad metal to prevent the growth of intermetallic alloys between the noble metal and the top metal of the bond pad.

It is an advantage of embodiments of the present invention that an adhesion and barrier layer can be provided between the noble metal and the bond pad metal to ensure a good mechanical resistance for an electrical connection to the semiconductor device, e.g. for a bond wire.

It is an advantage of embodiments of the present invention that an adhesion and barrier layer can be provided between the noble metal and the bond pad metal to ensure a high level of reliability at elevated temperatures, e.g. at temperatures of 150 or 175° C. or higher, e.g. during 1000 or 2000 hours or more.

It is an advantage of embodiments of the present invention that a cost effective method of fabricating semiconductor devices suitable for use in harsh media applications is achieved, e.g. processing costs can be low and/or fabrication runs can be performed in high volumes.

It is an advantage of embodiments of the present invention that a surface, including edges of metal structures, of the semiconductor device can be highly resistant against harsh media.

The above objective is accomplished by a method and device according to the present invention.

In a first aspect, the present invention relates to a method for fabricating a semiconductor device for use in harsh media. The method comprises providing a semiconductor die that comprises a metal contact region, covering the semiconductor die by at least one passivation layer and patterning the at least one passivation layer such as to form an opening to expose the metal contact region of the semiconductor die. The method furthermore comprises forming a contact layer that comprises a refractory metal on the exposed metal contact region, in which the contact layer comprises at least an adhesion layer and at least a diffusion barrier layer. The method also comprises patterning the contact layer such as to define a continuous part of the contact layer over the exposed metal contact region by exposing the at least one passivation layer around the entire edge of the continuous part, in which said continuous part of the contact layer overlaps and completely covers the opening in the at least one passivation layer. The method further comprises providing a noble metal layer over the contact layer such as to completely cover the continuous part of the contact layer, in which the noble metal layer furthermore extends over the edge of the continuous part of the contact layer such as to adhere to the exposed at least one passivation layer around the edge of the continuous part. The providing of the noble metal layer comprises sputtering the noble metal on the continuous part of the contact layer and on the exposed at least one passivation layer around the edge of the continuous part such as to establish a mechanical connection by atomic bonding between the sputtered noble metal and the contact layer and between the sputtered noble metal and the at least one passivation layer.

In a method in accordance with embodiments of the present invention, the patterning of the contact layer may comprise patterning the contact layer such that the continuous part of the contact layer extends in a direction away from the opening such as to form a redistribution bond pad area over and extending away from the metal contact region.

In a method in accordance with embodiments of the present invention, the sputtering of the noble metal may comprises sputtering a noble metal seed layer for electroplating on the continuous part of the contact layer and on the exposed at least one passivation layer around the edge of the continuous part, and the providing of the noble metal layer may comprise electroplating the noble metal onto the noble metal seed layer.

In a method in accordance with embodiments of the present invention, providing the noble metal layer may comprise forming a plating mould over the noble metal seed layer, and electroplating the noble metal may comprise electroplating the noble metal onto the noble metal seed layer inside a mould opening defined by the plating mould.

In a method in accordance with embodiments of the present invention, the mould opening may have a footprint in a plane parallel to the semiconductor die that is larger than a corresponding footprint of the continuous part of the contact layer.

In a method in accordance with embodiments of the present invention, the circumferential edge of the mould opening may be outside, and spaced away from, the footprint of the continuous part, i.e. outside and spaced away from the continuous part, by at least a predetermined margin, in each point along the circumferential edge.

In a method in accordance with embodiments of the present invention, providing the noble metal layer may comprise removing the plating mould after plating the noble metal.

In a method in accordance with embodiments of the present invention, providing the noble metal layer may comprise removing the noble metal seed layer and/or the contact layer where it is not covered by the electroplated noble metal.

In a method in accordance with embodiments of the present invention, providing the noble metal layer may comprise creating a lift-off mask defining a wall around the continuous part of the contact layer, and sputtering the noble metal on the continuous part and on the exposed at least one passivation layer around the edge of the continuous part may comprise sputtering the noble metal through the lift-off mask.

In a method in accordance with embodiments of the present invention, the lift-off mask may have a footprint at a base of the lift-off mask, where it adheres to the at least one passivation layer, that is larger than a footprint of the continuous part of the contact layer.

In a method in accordance with embodiments of the present invention, the lift-off mask may comprise a lower mask layer and an upper mask layer, an opening defined by the lower mask being larger than an opening defined by the upper mask such as to create an overhang of the upper mask layer to form a penumbra when sputtering the noble metal.

In a method in accordance with embodiments of the present invention, providing the noble metal layer may comprise applying a sputter etch before sputtering the noble metal.

In a method in accordance with embodiments of the present invention, providing the noble metal layer may comprise sputtering, through the lift-off mask, an adhesion layer directly on the contact layer and directly on the exposed at least one passivation layer before sputtering the noble metal through the lift-off mask, e.g. sputtering the noble metal indirectly on the contact layer and indirectly on the exposed at least one passivation layer, e.g. sputtering the noble metal directly on the adhesion layer.

In a method in accordance with embodiments of the present invention, the adhesion layer may be sputtered to a thickness in the range of one fiftieth to one fifth of the thickness of the contact layer and in the range of one fiftieth to one tenth of the thickness of the sputtered noble metal.

In a method in accordance with embodiments of the present invention, providing the noble metal layer may comprise thermally annealing the sputtered noble metal to relax mechanical stresses.

In a method in accordance with embodiments of the present invention, covering the semiconductor die by the at least one passivation layer may comprise providing a first passivation layer or a first stack of passivation layers on the semiconductor die and providing at least one repassivation layer on the first passivation layer or on the first stack of passivation layers, and patterning the at least one passivation layer may comprise patterning both the first passivation layer or the first stack of passivation layers and the repassivation layer such as to form an opening to expose the metal contact region of the semiconductor die through the first passivation layer or first stack of passivation layers and through the repassivation layer.

In a method in accordance with embodiments of the present invention, patterning the at least one passivation layer may comprise forming a first opening in the first passivation layer or in the first stack of passivation layers and forming a second opening in the repassivation layer, in which the second opening is smaller than the first opening.

In a method in accordance with embodiments of the present invention, patterning the at least one passivation layer may comprise forming a first opening in the first passivation layer or in the first stack of passivation layers and forming a second opening in the repassivation layer, in which the second opening is larger than the first opening, e.g. larger than the first opening and smaller than the continuous part of the contact layer that overlaps and completely covers the opening.

In a method in accordance with embodiments of the present invention, forming the contact layer may comprise sputtering at least the refractory metal onto the exposed metal contact region and onto the at least one passivation layer.

In a second aspect, the present invention also relates to a semiconductor device for use in harsh media, the semiconductor device comprising a silicon die that comprises a metal contact region and at least one passivation layer covering the semiconductor die. The at least one passivation layer is patterned such as to form an opening to the metal contact region of the semiconductor die. The device comprises a continuous part of a contact layer that comprising a refractory metal. For example, the device may comprise a contact layer having a continuous part, in which the contact layer, and thus its continuous part, comprise a refractory metal. The continuous part overlaps and completely covers the opening in the at least one passivation layer, contacts the metal contact region in the opening and contacts the at least one passivation layer along the entire edge of the continuous part. The contact layer, e.g. and thus its continuous part, comprises at least an adhesion layer and at least a diffusion barrier layer. The device comprises a noble metal layer arranged over the contact layer, the noble metal layer completely covering the continuous part of the contact layer, in which the noble metal layer extends over the entire edge of the continuous part of the contact layer to adhere to the at least one passivation layer around the edge of the continuous part.

In a semiconductor device in accordance with embodiments of the present invention, the noble metal layer may comprise a sloped edge around its entire circumference that tapers down toward the at least one passivation layer where the noble metal layer adheres to the at least one passivation layer around the edge of the continuous part.

In a semiconductor device in accordance with embodiments of the present invention, the sloped edge may taper down at an angle in the range of 1° to 20° with respect to the vertical, e.g. the taper may be less than 20°.

Particular and preferred aspects of the invention are set out in the accompanying independent and dependent claims. Features from the dependent claims may be combined with features of the independent claims and with features of other dependent claims as appropriate and not merely as explicitly set out in the claims.

These and other aspects of the invention will be apparent from and elucidated with reference to the embodiment(s) described hereinafter.

The drawings are only schematic and are non-limiting. In the drawings, the size of some of the elements may be exaggerated and not drawn on scale for illustrative purposes.

Any reference signs in the claims shall not be construed as limiting the scope.

In the different drawings, the same reference signs refer to the same or analogous elements.

DETAILED DESCRIPTION OF ILLUSTRATIVE EMBODIMENTS

The present invention will be described with respect to particular embodiments and with reference to certain drawings but the invention is not limited thereto but only by the claims. The drawings described are only schematic and are non-limiting. In the drawings, the size of some of the elements may be exaggerated and not drawn on scale for illustrative purposes. The dimensions and the relative dimensions do not correspond to actual reductions to practice of the invention.

Furthermore, the terms first, second and the like in the description and in the claims, are used for distinguishing between similar elements and not necessarily for describing a sequence, either temporally, spatially, in ranking or in any other manner. It is to be understood that the terms so used are interchangeable under appropriate circumstances and that the embodiments of the invention described herein are capable of operation in other sequences than described or illustrated herein.

Moreover, the terms top, under and the like in the description and the claims are used for descriptive purposes and not necessarily for describing relative positions. It is to be understood that the terms so used are interchangeable under appropriate circumstances and that the embodiments of the invention described herein are capable of operation in other orientations than described or illustrated herein.

It is to be noticed that the term "comprising", used in the claims, should not be interpreted as being restricted to the means listed thereafter; it does not exclude other elements or steps. It is thus to be interpreted as specifying the presence of the stated features, integers, steps or components as referred to, but does not preclude the presence or addition of one or more other features, integers, steps or components, or groups thereof. Thus, the scope of the expression "a device comprising means A and B" should not be limited to devices consisting only of components A and B. It means that with respect to the present invention, the only relevant components of the device are A and B.

Reference throughout this specification to "one embodiment" or "an embodiment" means that a particular feature, structure or characteristic described in connection with the embodiment is included in at least one embodiment of the present invention. Thus, appearances of the phrases "in one embodiment" or "in an embodiment" in various places throughout this specification are not necessarily all referring to the same embodiment, but may. Furthermore, the particular features, structures or characteristics may be combined in any suitable manner, as would be apparent to one of ordinary skill in the art from this disclosure, in one or more embodiments.

Similarly it should be appreciated that in the description of exemplary embodiments of the invention, various features of the invention are sometimes grouped together in a single embodiment, figure, or description thereof for the purpose of streamlining the disclosure and aiding in the understanding of one or more of the various inventive aspects. This method of disclosure, however, is not to be interpreted as reflecting an intention that the claimed invention requires more features than are expressly recited in each claim. Rather, as the following claims reflect, inventive aspects lie in less than all features of a single foregoing disclosed embodiment. Thus, the claims following the detailed description are hereby expressly incorporated into this detailed description, with each claim standing on its own as a separate embodiment of this invention.

Furthermore, while some embodiments described herein include some but not other features included in other embodiments, combinations of features of different embodiments are meant to be within the scope of the invention, and form different embodiments, as would be understood by those in the art. For example, in the following claims, any of the claimed embodiments can be used in any combination.

In the description provided herein, numerous specific details are set forth. However, it is understood that embodiments of the invention may be practiced without these specific details. In other instances, well-known methods, structures and techniques have not been shown in detail in order not to obscure an understanding of this description.

In a first aspect, the present invention relates to a method for fabricating a semiconductor device for use in harsh media. The method comprises providing a semiconductor die that comprises a metal contact region.

The method further comprises covering the semiconductor die by at least one passivation layer and patterning the at least one passivation layer such as to form an opening to expose the metal contact region of the semiconductor die.

The method further comprises forming a contact layer on the metal contact region, in which the contact layer comprises a refractory metal. The contact layer comprises at least an adhesion layer and at least a diffusion barrier layer.

The method also comprises patterning the contact layer, such that a continuous part of the contact layer is defined over the exposed metal contact region by exposing the at least one passivation layer around the entire edge of the continuous part, in which this continuous part of the contact layer overlaps and completely covers the opening in the at least one passivation layer.

The method further comprises providing a noble metal layer over the contact layer, such as to completely cover the continuous part of the contact layer, wherein the noble metal layer furthermore extends over the edges of the continuous part of the contact layer to contact the exposed at least one passivation layer around the edge of the continuous part.

This step of providing the noble metal layer comprises a step of sputtering the noble metal onto the continuous part of the contact layer and onto the exposed at least one passivation layer around the edge of the continuous part, such as to establish a mechanical connection by atomic bonding between the sputtered noble metal layer and both the contact layer and the at least one passivation layer;

Sputtering the noble metal may comprise sputtering a noble metal seed layer. This noble metal seed layer may be sputtered such as to provide a good mechanical connection to the edges of the continuous part of the contact layer that overlaps and completely covers the opening and a good mechanical connection to the exposed passivation layer.

The noble metal layer may comprise a metal or combination of metals, such as an alloy, that is resistant to corrosion and oxidation. Particularly, the noble metal layer may comprise gold, silver, palladium and/or platinum. The noble metal layer may also comprise tantalum, e.g. to provide a good adhesion.

For example, the noble metal layer may comprise a stack of a layer of tantalum, e.g. a thin layer of tantalum, and a layer of gold, silver, platinum, palladium or a metal alloy thereof. The thin layer of tantalum may form an adhesion layer to assure good adhesion of the noble metal to the passivation, e.g. to the (re)passivation layer(s).

The method may further comprise forming a plating mould over the seed layer, such as to define a mould opening. This mould opening may have a footprint in a plane parallel to the substrate that is larger than the continuous part of the contact layer that overlaps and completely covers the opening in the at least one passivation layer.

The method may further comprise electroplating noble metal in the mould opening defined by the plating mould. The method may also comprise removing the plating mould after plating the noble metal.

The method may also comprise removing the noble metal seed layer where it is not covered by the plated noble metal. Furthermore, the contact layer may also be removed where it is not covered by the plated noble metal.

Alternatively, providing the noble metal layer may comprise creating a lift-off mask that defines a wall around the continuous part of the contact layer. Sputtering the noble metal on the continuous part and on the exposed at least one passivation layer around the edge of the continuous part may comprise sputtering the noble metal through this lift-off mask. The lift-off mask may have a footprint at a base thereof, where it contacts the at least one passivation layer, that is larger than a footprint of the continuous part of the contact layer.

Figures 3, 4:
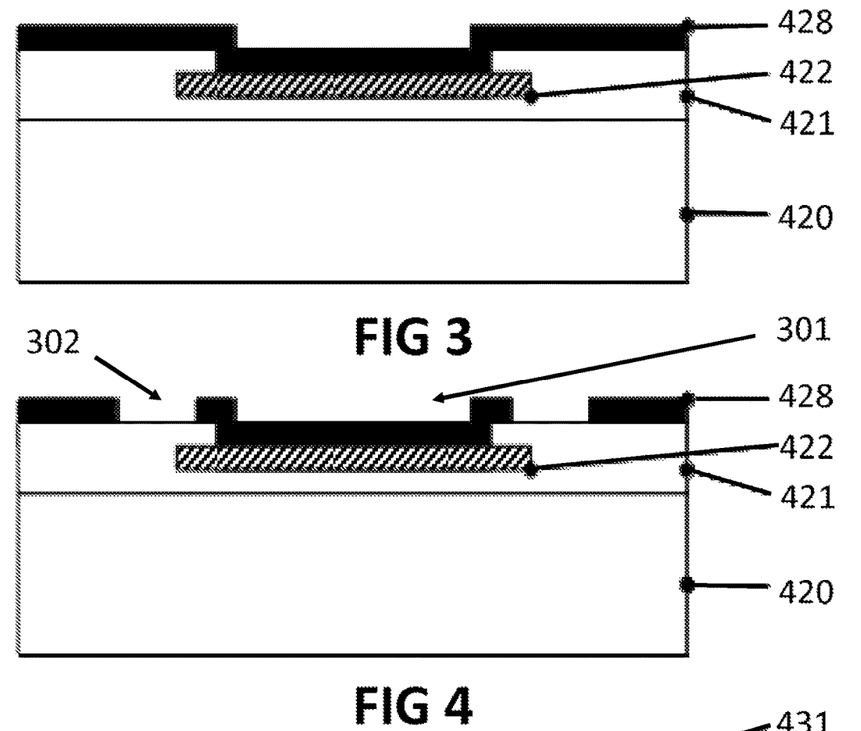
FIG. 3 illustrates a step of covering a semiconductor die by at least one passivation layer and patterning the at least one passivation to form an opening exposing a metal contact region of the semiconductor die, in a method in accordance with embodiments of the present invention.
FIG. 4 illustrates a step of patterning the contact layer, in a method in accordance with embodiments of the present invention.

Referring to FIG. 3, a method in accordance with embodiments of the present invention comprises providing a semiconductor die 420 that comprises a metal contact region 422, e.g. corresponding to a bond pad. For example, the metal contact region may correspond to a bond pad of an integrated circuit formed in the semiconductor die.

For example, the semiconductor device may comprise a plurality of constituent semiconductor devices to be interconnected, e.g. by bond wires connecting corresponding bond pads of the constituent semiconductor devices, for example in a hybrid sensor device.

The method further comprises covering the semiconductor die by at least one passivation layer 421 and patterning the at least one passivation layer 421 such as to form an opening to expose the metal contact region 422 of the semiconductor die, e.g. to expose the bond pad of the integrated circuit in the semiconductor die.

The patterning of the at least one passivation layer may comprise etching the opening, e.g. a contact hole, through the at least one passivation layer to expose the metal contact region 422.

The at least one passivation layer may for example comprise a silicon oxide layer and/or a silicon nitride layer.

Figure 12:
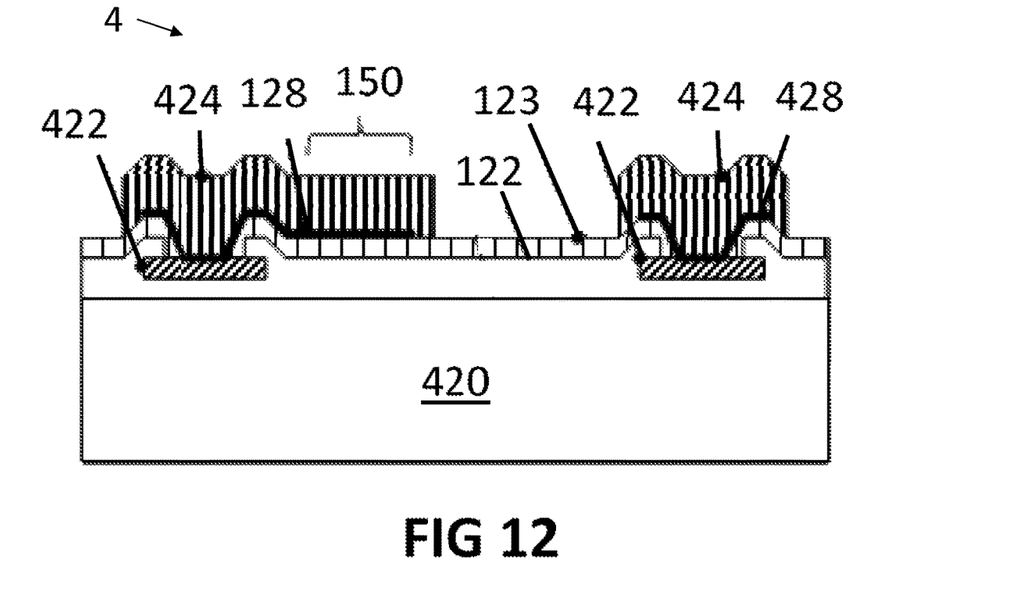
FIG. 12 illustrates a fourth exemplary device in accordance with embodiments of the present invention, in which the at least one passivation layer additionally comprises a repassivation layer.

For example, as illustrated in FIG. 12, the at least one passivation layer may comprise a first passivation layer 122 or a first stack of passivation layers on the semiconductor die, and at least one repassivation layer 123 on the first passivation layer 122 or on the first stack of passivation layers. In other words, covering the semiconductor die by the at least one passivation layer may comprise depositing a repassivation layer, such as a polyimide layer, on a passivation layer, e.g. directly over and in contact with the passivation layer. Likewise, patterning the at least one passivation layer may comprise patterning both the passivation layer and the repassivation layer such as to form an opening to expose the metal contact region of the semiconductor die through the passivation layer(s) and repassivation layer(s). For example, an opening in the first passivation layer or first stack of passivation layers and an opening in the at least one repassivation layer may be aligned, e.g. centered around a common geometric center, such as to expose the metal contact region. It is an advantage of such repassivation layer(s) that the chemical resistance and mechanical robustness of the passivation can be further improved by additional repassivation.

The opening in the repassivation that exposes the metal contact region may be smaller than the opening in the first passivation layer(s). This has the advantage that the polyimide can serve as an elastic buffer between the plated noble metal 424, which is sensitive to large thermal expansion, and the passivation of the chip, e.g. a nitride passivation. However, if it cannot be ascertained that chemically active atoms or molecules of the harsh environment cannot diffuse through the repassivation, e.g. the polyimide, to the bond pad metal, it may be preferable to make the opening in the repassivation layer larger than the opening in the first passivation layer(s), but still smaller than the footprint of the noble metal layer that is deposited later.

The method in accordance with embodiments of the present invention further comprises forming a contact layer 428 comprising a refractory metal on the exposed metal contact region, e.g. on the metal contact region exposed by the opening in the passivation layer, or on the metal contact region exposed by the aligned openings in the passivation layer and the repassivation layer. For example, the contact layer may be formed on the exposed metal contact region such as to physically contact the exposed metal contact region directly.

The contact layer 428 comprises at least an adhesion layer and at least a barrier layer. For example, the contact layer may be referred to as an adhesion/barrier layer, e.g. as a layer or multi-layer that is adapted for providing an adhesion function as well as a diffusion barrier function.

Forming the contact layer 428 may comprise sputtering at least the refractory metal onto the exposed metal contact region and onto the at least one passivation layer.

For example, the contact layer may be provided by sputtering refractory metals used in standard CMOS processing, such as W, Ti, TiW, TiN, Co, Ni, Mo, Ta and/or Pd. Forming the contact layer 428 may thus comprise sputtering a multi-layered adhesion/barrier layer.

For example, providing the contact layer may comprise sputtering a layer of titanium (Ti), e.g. which may provide good adhesion. For example, providing the contact layer may comprise sputtering with different metals to obtain a stack of an adhesion layer and a diffusion barrier. For example, a titanium nitride (TiN) diffusion barrier may be provided on top of a titanium (Ti) adhesion layer by adding a nitrogen plasma during a second half of the titanium sputtering process.

Referring to FIG. 4, the method in accordance with embodiments of the present invention further comprises patterning the contact layer 428, e.g. by applying photolithographic techniques, such as to define a continuous part 301 of the contact layer over the exposed metal contact region 422 by exposing the at least one passivation layer 421 around the entire edge of the continuous part, in which the continuous part 301 of the contact layer overlaps and completely covers the opening in the at least one passivation layer, e.g. the opening exposing the metal contact region 422 through the passivation layer(s), or through the passivation and repassivation layer(s). This continuous part 301 may be disconnected from any other part of the contact layer 428, if such other part remains, e.g. by the removed material of the contact layer where the at least one passivation layer 421 was exposed around the entire edge of the continuous part.

In other words, the contact layer 428, e.g. the adhesion/barrier layer, may be patterned in such a way that a structure in the contact layer is defined and isolated, in which this structure completely covers the opening, e.g. covering the interior walls of the concavity formed by the opening, and extends outward from the edges of the opening, e.g. such that this structure has a footprint in a plane parallel to the substrate that is larger than a corresponding footprint of the opening.

Particularly, exposing the at least one passivation layer 421 around the entire edge of the continuous part may comprise removing, e.g. etching away, a part 302 of the contact layer that forms a closed contour around the opening. This part 302 may be spaced away from the edge of the opening at every point along its entire circumference. The contact layer 428 may thus be patterned such that the contact layer 428 layer is removed where the edges of the noble metal will be defined in a following step of the method.

The part 302 forming the closed contour around the opening, e.g. where the at least one passivation layer 421 underneath the contact layer is locally exposed, may have a width, e.g. a contour line width, of at least 0.5 µm, e.g. in the range of 0.5 µm to 5 µm, along its entire circumference.

Patterning the contact layer may comprise defining slits in the contact layer in an area outside the continuous part 301, e.g. in an area separated from the continuous part 301 by the removed part 302 forming the closed contour around the opening, e.g. to enable a good adhesion of the sputtered noble metal, e.g. of the noble metal seed layer 429, outside the area where the continuous part is defined above the opening.

Figure 9:
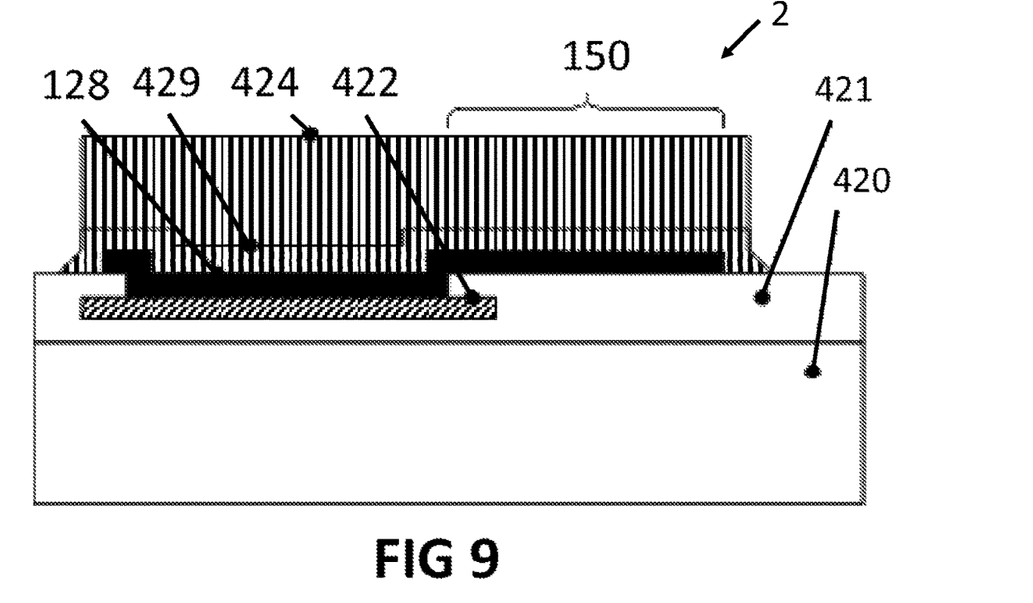
FIG. 9 illustrates a second exemplary device in accordance with embodiments of the present invention, in which the contact layer is patterned such that a continuous part of the contact layer, which overlaps and completely covers the opening in the at least one passivation layer, extends in a direction away from the opening such as to form a redistribution bond pad area.

Furthermore, as illustrated in FIG. 9, the step of patterning may also comprise patterning the contact layer 128 such that the continuous part of the contact layer, which overlaps and completely covers the opening in the at least one passivation layer, extends in a direction away from the opening such as to form a redistribution bond pad area 150 over and extending away from the metal contact region 422.

The method further comprises providing a noble metal over the contact layer 428 such as to completely cover said continuous part 301 of the contact layer. The noble metal extends over the edges of the continuous part of the contact layer to contact said exposed at least one passivation layer around the edge of the continuous part, e.g. extends over the entire edge, e.g. in each point along the circumference of the entire edge.

Providing the noble metal comprises sputtering the noble metal onto the continuous part 301 of the contact layer and onto the exposed at least one passivation layer around the edge of the continuous part such as to establish a mechanical connection by atomic bonding between the sputtered noble metal and the contact layer and between the sputtered noble metal and the at least one passivation layer.

It is an advantage of such sputtered noble metal layer that a remarkably good adhesion can be achieved between the noble metal and the top surface and side walls of the contact layer 428, e.g. the top surface and side walls formed by the continuous part 301. It is a further advantage that also a good adhesion is achieved between the noble metal and the passivation layer 421, e.g. where part 302 of the contact layer was removed to define the continuous part 301. It is an advantage of sputtering that the noble metal atoms bombard the contact layer and the at least one passivation layer with a kinetic energy that is sufficiently high to form good bonds.

Thus, a good mechanical adhesion can be ensured between the noble metal and the passivation adjacent to the structure of the contact layer that covers and surrounds the opening, such that aggressive media cannot reach this structure defined in the contact layer, e.g. cannot reach the diffusion barrier/adhesion layer.

FIG. 5 to FIG. 8 illustrate further steps of a first exemplary process flow of a method in accordance with embodiments of the present invention. In this first exemplary process flow, a protective noble metal layer may be realized in a semiconductor device for use in harsh media by means of electroplating.

Figure 5:
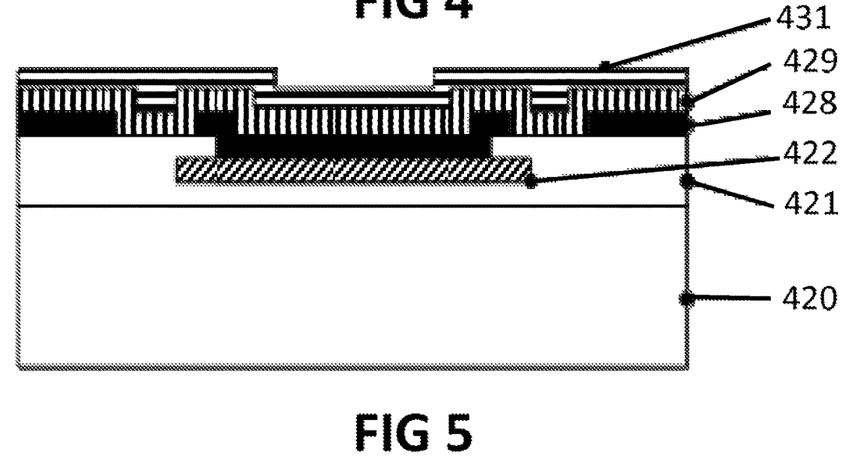
FIG. 5 illustrates a step of providing sputtering a noble metal seed layer for electroplating, in a first exemplary process flow of a method in accordance with embodiments of the present invention.

Referring to FIG. 5, in a method in accordance with embodiments of the present invention, sputtering the noble metal may comprise sputtering a noble metal seed layer 429 for electroplating, e.g. a layer of a noble metal having a low electrical resistance such as to be suitable as seed layer for electroplating of the noble metal. This noble metal seed layer 429 is sputtered such as to provide a good mechanical connection to the edge of the continuous part 301 of the contact layer 428 that overlaps and completely covers the opening and a good mechanical connection to the exposed passivation layer.

The deposited noble metal seed layer 429 may have a thickness in the range of 20 nm to 500 nm, e.g. in the range of 40 nm to 300 nm, e.g. in the range of 50 nm to 200 nm.

A method in accordance with embodiments of the present invention may also comprise depositing a temporary adhesion layer 431 on top of the noble metal seed layer 429, e.g. again by sputtering, to ensure a good adhesion of the plating mould 433. For example, this temporary adhesion layer may comprise any suitable material, e.g. not necessarily a noble metal.

Figure 6:
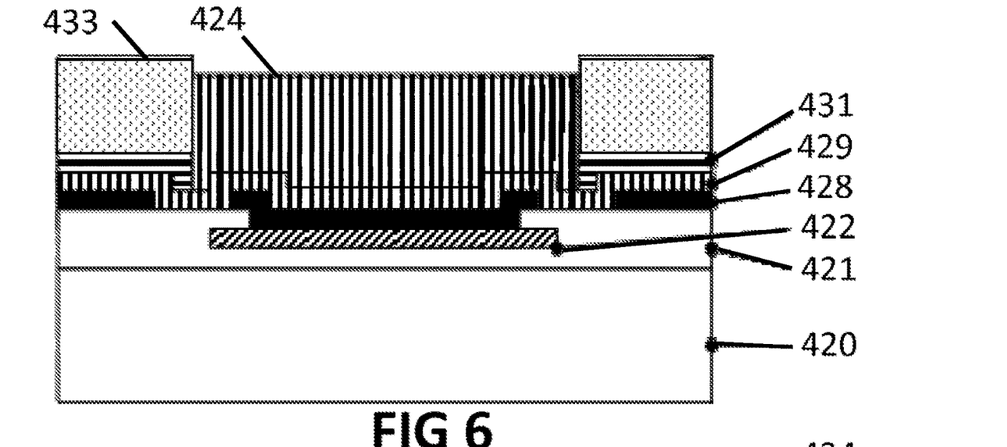
FIG. 6 illustrates a step of forming a plating mold over the sputtered noble metal seed layer and electroplating noble metal inside the plating mould, in a first exemplary process flow of a method in accordance with embodiments of the present invention.

Referring to FIG. 6, the method may further comprise forming a plating mould 433 over the seed layer, e.g. on and directly in contact with the noble metal seed layer 429, or alternatively on and directly in contact with the temporary adhesion layer 431. The plating mould may define a mould opening. For example, this plating mould 433 may comprise mould walls formed by a masking material, e.g. a resist material.

This mould opening defined by the plating mould 433 may have a footprint in a plane parallel to the substrate that is larger than the continuous part 301 of the contact layer 428 that overlaps and completely covers the opening in the at least one passivation layer. For example, an edge of the mould opening may be spaced away from the edge of the continuous part 301 by a gap, e.g. a small gap, e.g. a gap in the range of 0.5 µm to 5 µm, e.g. in each point around the circumference of the continuous part 301.

The method may further comprise removing the temporary adhesion layer 431 where it is not covered by the plating mould 433, e.g. to expose the noble metal seed layer 429 inside the mould opening, e.g. inside the volume for plating defined by the plating mould.

The method may further comprise electroplating noble metal 424 inside the plating mould, e.g. inside the mould opening, e.g. inside the cavity defined by the mould walls. For example, the noble metal 424 may be plated to a thickness in the range of 0.25 µm to 40 µm.

Figure 7:
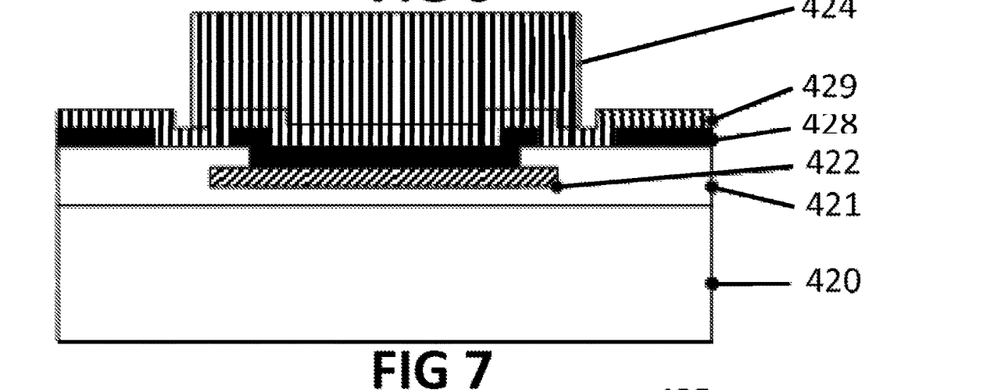
FIG. 7 illustrates a step of removing the plating mould after electroplating the noble metal, in a first exemplary process flow of a method in accordance with embodiments of the present invention.

Referring to FIG. 7, the method may also comprise removing the plating mould 433, e.g. removing the masking material forming the walls of the mould opening, after plating the noble metal 424.

The method may also comprise removing the temporary adhesion layer 431, e.g. by applying solvents and/or etch solutions.

Figure 8:
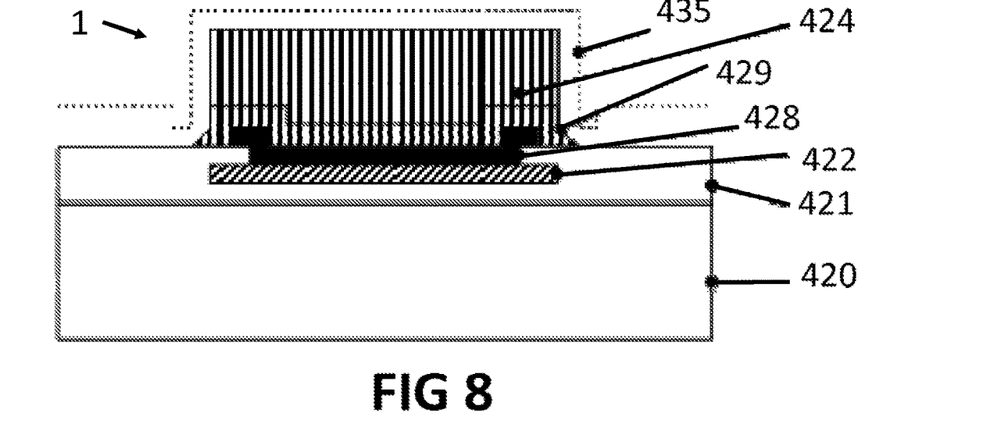
FIG. 8 shows a first exemplary device in accordance with embodiments of the present invention.

Referring to FIG. 8, the method may also comprise removing the noble metal seed layer 429 where it is not covered by the plated noble metal 424. Furthermore, the contact layer 428 may also be removed where it is not covered by the plated noble metal 424.

This removing of the noble metal seed layer 429 and the contact layer 428, where these layers are not covered by the plated noble metal 424, may comprise selective etching and/or sputter etching. For example, the volume of the plated noble metal 424 may be reduced from an originally plated volume 435 to the volume depicted in FIG. 8. It is an advantage that by such etching, sloped sidewalls formed by a remnant of the noble metal seed layer 429 may be formed at the base of the plated noble metal 424, where it contacts the at least one passivation layer 421.

The mould opening of the plating mould 433 may have a footprint in a plane parallel to the semiconductor die that is larger than a corresponding footprint of the continuous part of the contact layer, such that a circumferential edge of the mould opening is outside and spaced away from the footprint of the continuous part by at least a predetermined margin, in each point along the circumferential edge.

Preferably, the width of this predetermined margin, e.g. the gap referred to hereinabove, may be at least, e.g. greater than or equal to, twice an etch depth for etching the noble metal seed layer 429 when removing the noble metal seed layer 429 where it is not covered by the electroplated noble metal 424.

For example, when etching the noble metal seed layer 429, the plated noble metal 424 may also reduce in volume, as described hereinabove. Therefore, by appropriately dimensioning the plating mould, the electroplated noble metal 424 may extend over and beyond the continuous part of the contact layer by more than the thickness of the material that is etched away, e.g. to ensure that a suitable layer of the plated noble metal remains to cover and protect the continuous part of the contact layer. Thus, the contact layer 428 structure on the metal contact region 422, which structure provides adhesion and acts as a diffusion barrier, can be fully covered, and thus protected from harsh media, by the noble metal in the device obtained by a method in accordance with embodiments of the present invention. Furthermore, good adhesion of the noble metal to the passivation layer adjacent to the contact layer can be obtained. For example, it may be noted that it has been observed that electroless plating does not offer such an adhesion between the deposited metal and the passivation.

Referring to FIG. 9, if in a method in accordance with embodiments of the present invention a redistribution bond pad area 150 is formed when patterning the contact layer 128, a good mechanical strength can be established by the sputtered noble metal seed layer 429 that joins the plated noble metal 424 to the at least one passivation layer 421, as well as to the contact layer 128. The edges of the contact layer structure covering the opening and the redistribution bond pad area 150 are also advantageously covered by the sputtered noble metal of the noble metal seed layer. Chemical resistance can be provided by the strength of the sputtered connection of the noble metal to the passivation. Due to the sputtering, this connection may be sufficiently strong to ensure that harsh media cannot penetrate between this gold and the passivation.

Figure 10:
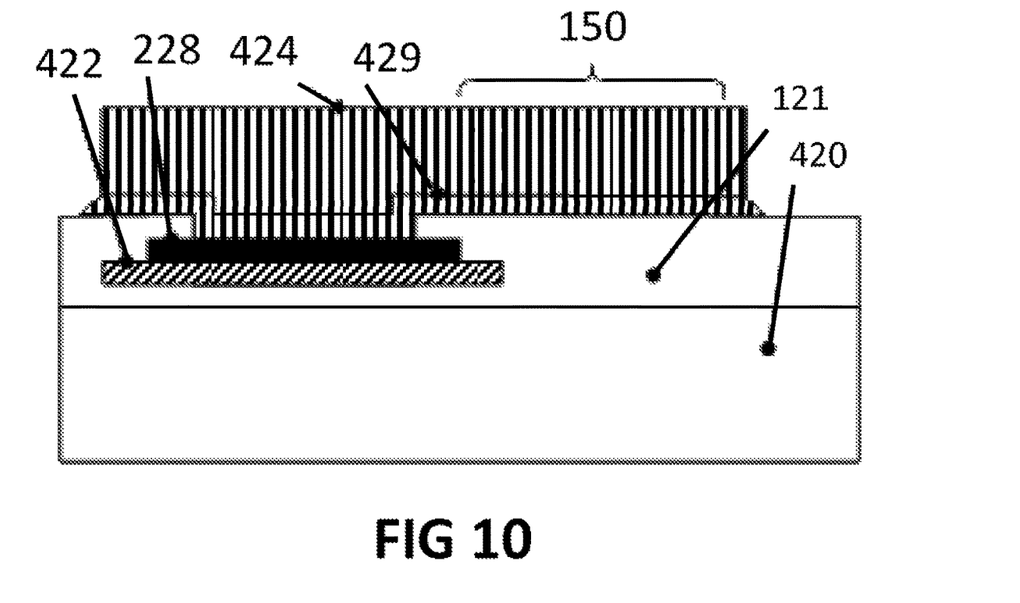
FIG. 10 shows, for comparative purposes, a similar device as shown in FIG. 9 that could be obtained by an approach that is not in accordance with embodiments of the present invention.

Referring to FIG. 10, in an alternative method provided for comparison, a redistribution bond pad area 150 could be formed by extending the mould opening defined by the plating mould, for example, where the contact layer 228 is deposited and patterned before the passivation layer 121 is deposited and patterned. As a consequence, the noble metal seed layer would provide the mechanical connection between the bond pad area 150 and the passivation 121. However, this connection may be of limited strength compared the device shown in FIG. 9, where the adhesion is ensured by the contact layer acting as a dedicated adhesion layer. Therefore, the bond strength of the comparative structure shown in FIG. 10 could be insufficient when the interface between the noble metal and the passivation is mechanically stressed, e.g. during wire-bonding with ultrasonic bonding force or when encapsulated by materials such as mould compound in a package.

Figure 11:
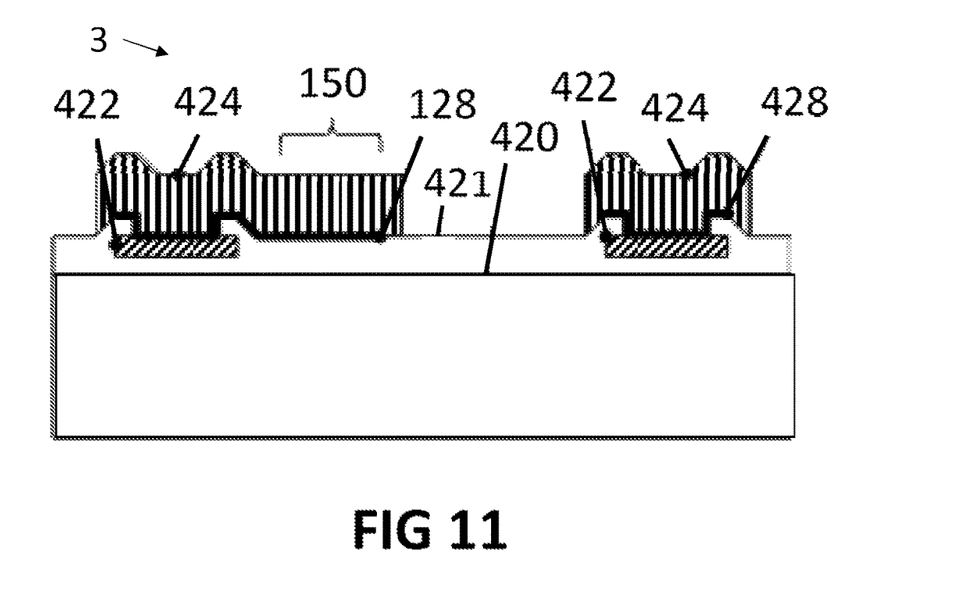
FIG. 11 illustrates a third exemplary device in accordance with embodiments of the present invention.

Referring to FIG. 11, a semiconductor device as can be fabricated by a method in accordance with embodiments of the present invention is shown. The semiconductor device may comprise a plurality of constituent semiconductor devices to be interconnected, e.g. by bond wires connecting corresponding bond pads of the constituent semiconductor devices. A similar device is shown in FIG. 12, in which a repassivation layer is included.

FIG. 13 to FIG. 16 illustrate further steps of a second exemplary process flow of a method in accordance with embodiments of the present invention. In this second exemplary process flow, a protective noble metal layer may be realized in a semiconductor device for use in harsh media by means of a lift-off process.

For example, as explained hereinabove in reference to FIG. 3, the method comprises providing the semiconductor die 420 comprising a metal contact region 422, covering the semiconductor die 420 by at least one passivation layer 421 and patterning the at least one passivation layer 421 such as to form an opening to expose the metal contact region 422 of the semiconductor die 420. The at least one passivation layer may also comprise a repassivation layer, e.g. as described hereinabove.

The method further comprises forming a contact layer 528 comprising a refractory metal on the exposed metal contact region 422, e.g. by sputtering, in which the contact layer comprises at least an adhesion layer and at least a diffusion barrier layer. Exemplary features relating to forming such contact layer 528 shall be clear from the description provided hereinabove in reference to the contact layer 428.

Figure 13:
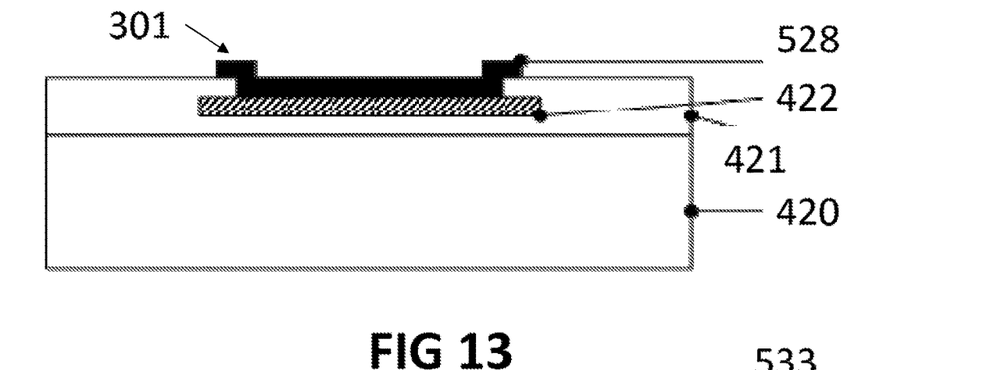
FIG. 13 illustrates a step of patterning the contact layer, in a method in accordance with embodiments of the present invention.

Referring to FIG. 13, the method in accordance with embodiments of the present invention further comprises patterning the contact layer 528, e.g. by applying photolithographic techniques, such as to define a continuous part 301 of the contact layer over the exposed metal contact region 422 by exposing the at least one passivation layer 421 around the entire edge of the continuous part, in which the continuous part 301 of the contact layer overlaps and completely covers the opening in the at least one passivation layer, e.g. the opening exposing the metal contact region 422 through the passivation layer(s), or through the passivation and repassivation layer(s).

Patterning the contact layer 528 may comprise removing the rest of the contact layer 528 outside the continuous part 301, e.g. such that no other part of the contact layer 528 remains. However, in embodiments of the present invention in which a protective noble metal layer may be realized in a semiconductor device for use in harsh media by means of a lift-off process, such as illustrated by the second exemplary process flow, the contact layer may equally be patterned by removing, e.g. etching away, a part 302 of the contact layer that forms a closed contour around the opening, e.g. as illustrated in FIG. 4. Furthermore, as illustrated by the fabricated device shown in FIG. 16, the step of patterning may also comprise patterning the contact layer 128 such that the continuous part of the contact layer, which overlaps and completely covers the opening in the at least one passivation layer, extends in a direction away from the opening such as to form a redistribution bond pad area 150 over and extending away from the metal contact region 422.

Figure 14:
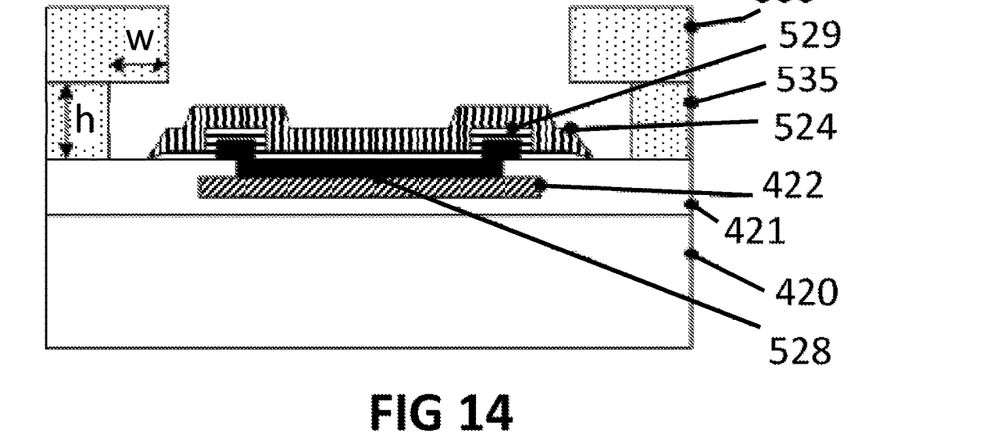
FIG. 14 illustrates a step of creating a lift-off mask and sputtering the noble metal through the lift-off mask, in a second exemplary process flow of a method in accordance with embodiments of the present invention

Referring to FIG. 14, the method further comprises providing a noble metal over the contact layer 528 such as to completely cover said continuous part 301 of the contact layer. The noble metal extends over the edges of the continuous part of the contact layer to contact said exposed at least one passivation layer around the edge of the continuous part, e.g. extends over the entire edge, e.g. in each point along the circumference of the entire edge.

In a method in accordance with embodiments of the present invention, providing the noble metal may comprise creating a lift-off mask. The lift-off mask may define a wall around the continuous part 301 of the contact layer. The lift-off mask may thus have a footprint at its base where it contacts the at least one passivation layer 421, in a plane parallel to the substrate, that is larger than the continuous part 301 of the contact layer 428 that overlaps and completely covers the opening in the at least one passivation layer. For example, an edge of the lift-off mask at its base may be spaced away from the edge of the continuous part 301 by a gap, e.g. a small gap, e.g. a gap in the range of 0.5 µm to 5 µm, e.g. in each point around the circumference of the continuous part 301.

The lift-off mask may comprise a lower mask layer 535 and an upper mask layer 533. The opening in the lower mask 535 may be larger than the opening in the upper mask 533 so that an overhang w of the upper mask layer 533 is created. Furthermore, the lower mask layer 535 may have a thickness h, such that the overhang w, spaced away from the base of the lower mask 535 by the distance h, creates a penumbra in the sputtering process by which the noble metal is deposited. This shadow effect may be sufficiently large, e.g. by selecting thickness h and overhang w appropriately, to prevent that the side walls of the lower mask layer 535 are covered by the noble metal during the sputtering process. This lower sidewall may be preferably left free of sputtered metal to allow a lift-off solution to react with the masking material.

A slope of the sputtered layer on the wafer may be determined by a ratio of the thickness h and the final metal thickness of the metal sputtered through the lift-off mask opening.

Providing the noble metal may comprise applying a sputter etch before the sputter process. During such sputter etch, atoms with high energy may remove thin layers from the surface to be sputtered on, such as to remove native oxides, and polarize the surface.

Providing the noble metal may comprise sputtering an adhesion layer 529 directly on the contact layer 528 and directly on the exposed at least one passivation layer 421. This sputtering may be performed through the lift-off mask. For example, such adhesion layer 529 may be sputtered to a thickness in the range of 2 nm to 20 nm. Sputtering through such mask opening of a lift-off mask is particularly advantageous, since it allows the sputtered material to be deposited incrementally during sputtering within a well-defined region. Therefore, a further step of patterning the sputtered material is not required, which might otherwise form edges that could be attacked by corrosive chemicals in the harsh environment. Furthermore, the edges of the deposited material may be advantageously sloped due to the buildup of the material by sputtering through the mask, such that, when sputtering a plurality of layers and/or materials through the lift-off mask, each previously deposited layer is entirely covered, including its sidewalls, and thus protected by the subsequently deposited layer(s). Furthermore, the tapered edges that finally result from the sputtering process may prevent that mechanical forces, such as caused by vibrations, act on a vertical sidewall along the edges, which could create defects at the base where it mechanically contacts the (re)passivation due to a lever effect, thus potentially allowing corrosive chemicals to reach the (re)passivation.

Providing the noble metal comprises sputtering the noble metal onto the continuous part 301 of the contact layer 528 and onto the exposed at least one passivation layer around the edge of the continuous part such as to establish a mechanical connection by atomic bonding between the sputtered noble metal and the contact layer and between the sputtered noble metal and the at least one passivation layer.

Sputtering the noble metal may further comprise sputtering the noble metal 524 through the lift-off mask, e.g. after sputtering the adhesion layer 529, for example while maintaining a vacuum over the lift-off mask in between the sputtering of the adhesion layer 529 and the sputtering of the noble metal 524. For example, the noble metal may be sputtered after the sputtering of the adhesion layer 529 without exposing the wafer to oxygen or nitrogen to prevent the formation of native oxides or nitrides.

The noble metal may for example be sputtered to a thickness in the range of 50 nm to 500 nm. The thickness of the noble metal is preferably less than 1000 nm, e.g. in the range of 50 nm to 500 nm, to allow easy implementation of the lift-off process and to keep the cost within reasonable limits. The thickness of the noble metal is preferably more than 50 nm, e.g. in the range of 100 nm to 500 nm, e.g. in the range of 150 nm to 350 nm, such as 200 nm, to provide sufficient material to establish a reliable wire bond.

The noble metal may be sputtered to at least the same thickness as the contact layer, e.g. as the diffusion barrier layer. For example, the diffusion barrier provided by the contact layer may be at least 100 nm thick, and the noble metal may also be sputtered to a thickness of at least 100 nm.

The noble metal 524 may be sputtered to a thickness in the range of 10 times to 50 times the thickness of the adhesion layer 529, e.g. such that the thin adhesion layer is sufficiently covered by the noble metal and not exposed to the harsh environment.

For example, the adhesion layer 529 may be a tantalum layer having a thickness of about 5 nm and the noble metal 524 may consist of platinum sputtered to a thickness of about 200 nm. This combination may provide a particularly good adhesion quality for wire bonding as well as a good resistance to harsh media.

It is an advantage of such sputtered noble metal layer that a remarkably good adhesion can be achieved between the noble metal and the top surface and side walls of the contact layer 528, e.g. the top surface and side walls formed by the continuous part 301. It is a further advantage that also a good adhesion is achieved between the noble metal and the passivation layer 421, e.g. where part 302 of the contact layer was removed to define the continuous part 301. It is an advantage of sputtering that the noble metal atoms bombard the contact layer and the at least one passivation layer with a kinetic energy that is sufficiently high to form good bonds.

Thus, a good mechanical adhesion can be ensured between the noble metal and the passivation adjacent to the structure of the contact layer that covers and surrounds the opening, such that aggressive media cannot reach this structure defined in the contact layer, e.g. cannot reach the diffusion barrier/adhesion layer.

The lift-off process may advantageously provide a good encapsulation of the adhesion layer 529. For example, when an adhesion layer 529 is sputtered between the at least one passivation layer 421 and the noble metal 524, using an etching mask on a stack of an adhesion layer and noble metal layer would result in an exposed edge of the adhesion layer at the bottom of the edges. However, by sputtering the stack as part of a lift-off process, the adhesion layer can be fully covered by the noble metal, including the sidewalls of the adhesion layer. For example, the edges of the adhesion layer can be completely covered by the noble metal, since substantially more noble metal may be sputtered through the same lift-off mask opening than adhesion metal was sputtered through before.

Figure 15:
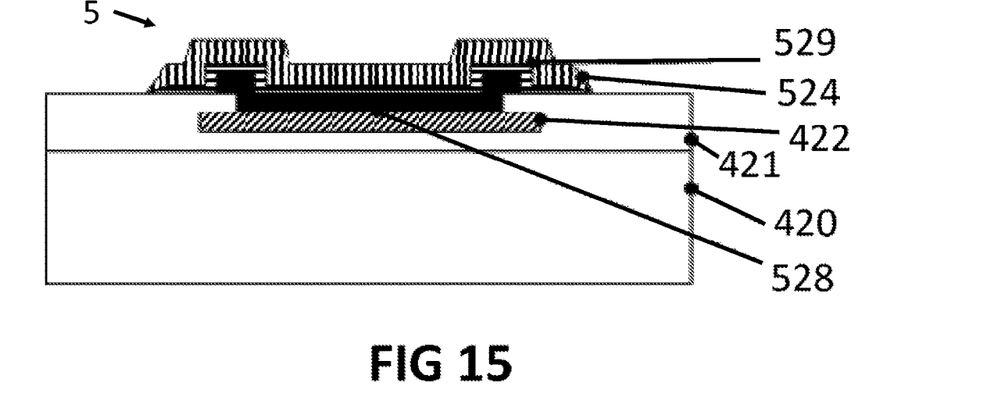
FIG. 15 illustrates a fifth exemplary device in accordance with embodiments of the present invention.

Referring to FIG. 15, after sputtering of the noble metal 524, the lift-off mask, e.g. the lower mask layer 535 and the upper mask layer 533, may be removed, e.g. using a lift-off solution.

Furthermore, the method in accordance with embodiments of the present invention may comprise thermally annealing the sputtered layers to relax stresses in the sputtered layers, e.g. at a temperature in the range of 200° C. to 600° C. During the metal sputtering, the kinetic energy of the sputtered atoms may be so high that atoms penetrate into the surface they are sputtered on and push surrounding atoms in lateral directions. While this can advantageously achieve good adhesion, this may also cause compressive stress. This stress can be relaxed by heating the wafer at a temperature that gives enough thermal energy to the atoms to re-settle.

In a second aspect, the present invention also relates to a semiconductor device for use in harsh media.

Referring to FIG. 8, FIG. 9, FIG. 11, FIG. 12, FIG. 15 and FIG. 16, various exemplary semiconductor devices 1,2,3,4, 5,6 for use in harsh media in accordance with embodiments of the present invention are shown.

These semiconductor devices comprise a silicon die 420 that a metal contact region 422, e.g. a bond pad region.

The semiconductor device also comprises at least one passivation layer 421 covering the semiconductor die 420 and patterned such as to form an opening to the metal contact region 422 of the semiconductor die 420.

Referring to FIG. 12, the at least one passivation layer may comprise a first passivation layer 122 or a first stack of passivation layers on the semiconductor die 420 and at least one repassivation layer 123 on the first passivation layer 122 or on the first stack of passivation layers. Both the first passivation layer (or the first stack of passivation layers) and the repassivation layer may be patterned such as to form an opening to the metal contact region 422 of the semiconductor die, e.g. an opening extending through the first passivation layer (or first stack of passivation layers) and through the repassivation layer. Furthermore, a first opening in the first passivation layer 122 (or in the first stack of passivation layers) and a second opening in the repassivation layer 123 may be provided, in which the second opening is smaller than the first opening.

The semiconductor devices 1,2,3,4,5,6 further comprise a continuous part 301 of a contact layer 428; 128; 528 that comprises a refractory metal. The contact layer comprises at least an adhesion layer and at least a diffusion barrier layer This continuous part 301 overlaps and completely covers the opening in the at least one passivation layer 421, contacts the metal contact region 422 in the opening and contacts the at least one passivation layer 421 along the entire edge of the continuous part 301.

The semiconductor devices 1,2,3,4,5,6 according to embodiments of the present invention comprises a noble metal layer arranged over the contact layer. The noble metal layer completely covers the continuous part 301 of the contact layer. The noble metal layer furthermore extends over the entire edge of the continuous part 301 of the contact layer to contact the at least one passivation layer 421 around the edge of the continuous part 301.

The noble metal layer may comprise a sloped edge around its entire circumference that tapers down toward the at least one passivation layer 421 where the noble metal layer contacts the at least one passivation layer 421 around the edge of the continuous part 301.

Referring to FIG. 11 and FIG. 12, the semiconductor device 3 may comprise a plurality of constituent semiconductor devices, e.g. cointegrated in the same semiconductor die 420.

Referring to FIG. 9, FIG. 11, FIG. 12 and FIG. 16, in a semiconductor device 2,3,4,6 in accordance with embodiments of the present invention, the continuous part 301 of the contact layer may extends in a direction away from the opening such as to form a redistribution bond pad area 150 over and extending away from the metal contact region 422.

Referring to FIG. 8 and FIG. 9, the noble metal layer in a semiconductor device 1,2 in accordance with embodiments of the present invention may comprise a noble metal seed layer 429 of the noble metal sputtered on the continuous part 301 and on the at least one passivation layer around the edge of the continuous part, in which a mechanical connection by atomic bonding is established between the sputtered noble metal and the contact layer and between the sputtered noble metal and the at least one passivation layer.

The noble metal layer may further comprise the noble metal 424 plated onto the noble metal seed layer 429.

Figure 16:
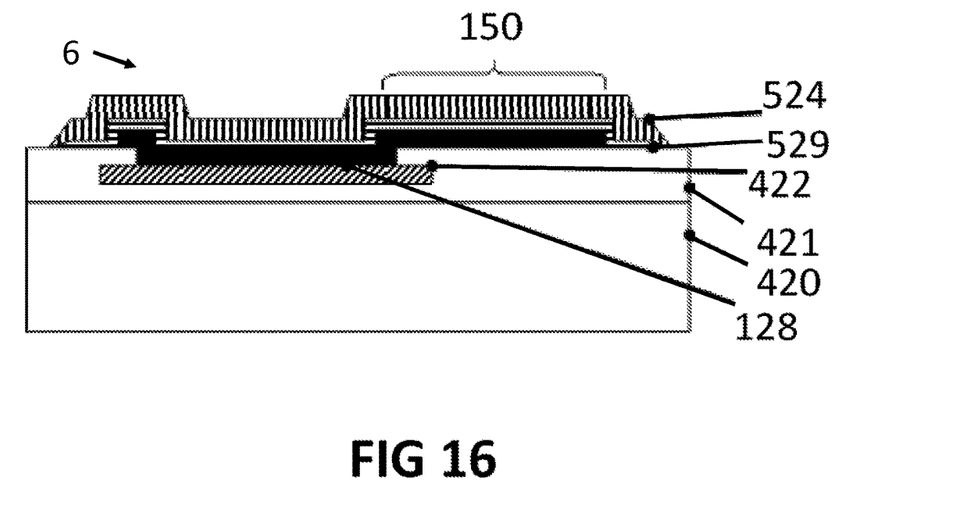
FIG. 16 illustrates a sixth exemplary device in accordance with embodiments of the present invention.

Referring to FIG. 15 and FIG. 16, the noble metal layer in a semiconductor device 5,6 in accordance with embodiments of the present invention may comprise a noble metal layer 524 of the noble metal sputtered on the continuous part 301 and on the at least one passivation layer around the edge of the continuous part, in which a mechanical connection is established between the sputtered noble metal and the contact layer and between the sputtered noble metal and the at least one passivation layer, e.g. via an intermediate adhesion layer 529.

The invention claimed is:

1. A method for fabricating a semiconductor device for use in harsh media, the method comprising:
   providing a semiconductor die comprising a metal contact region;
   covering said semiconductor die by at least one passivation layer and patterning the at least one passivation layer such as to form an opening to expose the metal contact region of the semiconductor die;
   forming a contact layer comprising a refractory metal on said exposed metal contact region, in which said contact layer comprises at least an adhesion layer and at least a diffusion barrier layer;
   patterning said contact layer such as to define a continuous part of the contact layer over the exposed metal contact region by exposing the at least one passivation layer around the entire edge of the continuous part, in which said continuous part of said contact layer overlaps and completely covers said opening in the at least one passivation layer; and
   providing a noble metal layer over said contact layer such as to completely cover said continuous part of the contact layer, wherein said noble metal layer furthermore extends over said edge of said continuous part of the contact layer such as to adhere to said exposed at least one passivation layer around the edge of the continuous part;
   wherein said providing of said noble metal layer comprises sputtering said noble metal on said continuous part of the contact layer and on the exposed at least one passivation layer around the edge of the continuous part such as to establish a mechanical connection by atomic bonding between the sputtered noble metal and the contact layer and between the sputtered noble metal and the at least one passivation layer; and
   wherein sputtering said noble metal comprises sputtering a noble metal seed layer for electroplating on said continuous part of the contact layer and on the exposed at least one passivation layer around the edge of the continuous part, and wherein providing said noble metal layer further comprises electroplating said noble metal onto the noble metal seed layer.

2. The method of claim 1, wherein said patterning of said contact layer comprises patterning said contact layer such that the continuous part of the contact layer extends in a direction away from said opening such as to form a redistribution bond pad area over and extending away from the metal contact region.

3. The method of claim 1, wherein providing said noble metal layer further comprises forming a plating mould over the noble metal seed layer,
   wherein electroplating said noble metal comprises electroplating said noble metal onto the noble metal seed layer inside a mould opening defined by the plating mould,
   wherein providing said noble metal layer further comprises removing said plating mould after electroplating said noble metal,
   and wherein providing said noble metal layer further comprises removing the noble metal seed layer and/or the contact layer where it is not covered by the electroplated noble metal.

4. The method of claim 3, wherein said mould opening has a footprint in a plane parallel to said semiconductor die that is larger than a corresponding footprint of the continuous part of the contact layer.

5. The method of claim 4, wherein the circumferential edge of the mould opening is outside and spaced away from the footprint of the continuous part by at least a predetermined margin, in each point along said circumferential edge.

6. The method of claim 1, wherein covering said semiconductor die by said at least one passivation layer comprises providing a first passivation layer or a first stack of passivation layers on the semiconductor die and providing at least one repassivation layer on the first passivation layer or on the first stack of passivation layers, and
   wherein patterning said at least one passivation layer comprises patterning both the first passivation layer or the first stack of passivation layers and the repassivation layer such as to form an opening to expose the metal contact region of the semiconductor die through the first passivation layer or first stack of passivation layers and through the repassivation layer.

7. The method of claim 6, wherein patterning said at least one passivation layer comprises forming a first opening in the first passivation layer or in the first stack of passivation layers and forming a second opening in the repassivation layer, in which the second opening is smaller than the first opening.

8. The method of claim 1, wherein forming said contact layer comprises sputtering at least said refractory metal onto said exposed metal contact region and onto said at least one passivation layer.

9. A method for fabricating a semiconductor device for use in harsh media, the method comprising:
   providing a semiconductor die comprising a metal contact region;
   covering said semiconductor die by at least one passivation layer and patterning the at least one passivation layer such as to form an opening to expose the metal contact region of the semiconductor die;
   forming a contact layer comprising a refractory metal on said exposed metal contact region, in which said contact layer comprises at least an adhesion layer and at least a diffusion barrier layer;
   patterning said contact layer such as to define a continuous part of the contact layer over the exposed metal contact region by exposing the at least one passivation layer around the entire edge of the continuous part, in which said continuous part of said contact layer overlaps and completely covers said opening in the at least one passivation layer; and
   providing a noble metal layer over said contact layer such as to completely cover said continuous part of the contact layer, wherein said noble metal layer furthermore extends over said edge of said continuous part of the contact layer such as to adhere to said exposed at least one passivation layer around the edge of the continuous part;
   wherein said providing of said noble metal layer comprises sputtering said noble metal on said continuous part of the contact layer and on the exposed at least one passivation layer around the edge of the continuous part such as to establish a mechanical connection by atomic bonding between the sputtered noble metal and the contact layer and between the sputtered noble metal and the at least one passivation layer;

wherein providing the noble metal layer comprises creating a lift-off mask defining a wall around the continuous part of the contact layer, and wherein sputtering said noble metal on the continuous part and on the exposed at least one passivation layer around the edge of the continuous part comprises sputtering said noble metal through said lift-off mask;

wherein providing the noble metal layer further comprises sputtering, through said lift-off mask, an adhesion layer directly on the contact layer and directly on the exposed at least one passivation layer before sputtering said noble metal through said lift-off mask; and wherein said adhesion layer is sputtered to a thickness in the range of one fiftieth to one fifth of the thickness of said contact layer and in the range of one fiftieth to one tenth of the thickness of said sputtered noble metal.

10. A method for fabricating a semiconductor device for use in harsh media, the method comprising:

providing a semiconductor die comprising a metal contact region;

covering said semiconductor die by at least one passivation layer and patterning the at least one passivation layer such as to form an opening to expose the metal contact region of the semiconductor die;

forming a contact layer comprising a refractory metal on said exposed metal contact region, in which said contact layer comprises at least an adhesion layer and at least a diffusion barrier layer;

patterning said contact layer such as to define a continuous part of the contact layer over the exposed metal contact region by exposing the at least one passivation layer around the entire edge of the continuous part, in which said continuous part of said contact layer overlaps and completely covers said opening in the at least one passivation layer; and providing a noble metal layer over said contact layer such as to completely cover said continuous part of the contact layer, wherein said noble metal layer furthermore extends over said edge of said continuous part of the contact layer such as to adhere to said exposed at least one passivation layer around the edge of the continuous part;

wherein said providing of said noble metal layer comprises sputtering said noble metal on said continuous part of the contact layer and on the exposed at least one passivation layer around the edge of the continuous part such as to establish a mechanical connection by atomic bonding between the sputtered noble metal and the contact layer and between the sputtered noble metal and the at least one passivation layer;

wherein covering said semiconductor die by said at least one passivation layer comprises providing a first passivation layer or a first stack of passivation layers on the semiconductor die and providing at least one repassivation layer on the first passivation layer or on the first stack of passivation layers, and wherein patterning said at least one passivation layer comprises patterning both the first passivation layer or the first stack of passivation layers and the repassivation layer such as to form an opening to expose the metal contact region of the semiconductor die through the first passivation layer or first stack of passivation layers and through the repassivation layer; and wherein patterning said at least one passivation layer comprises forming a first opening in the first passivation layer or in the first stack of passivation layers and forming a second opening in the repassivation layer, in which the second opening is smaller than the first opening.

* * * * *